(12) United States Patent
Su et al.

(10) Patent No.: US 10,079,254 B2
(45) Date of Patent: Sep. 18, 2018

(54) CHIP SCALE PACKAGE AND RELATED METHODS

(71) Applicant: SEMICONDUCTOR COMPONENTS INDUSTRIES, LLC, Phoenix, AZ (US)

(72) Inventors: Bingzhi Su, Boise, ID (US); Derek Gochnour, Boise, ID (US); Larry Kinsman, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/674,738

(22) Filed: Aug. 11, 2017

(65) Prior Publication Data

US 2018/0019275 A1     Jan. 18, 2018

Related U.S. Application Data

(62) Division of application No. 15/210,716, filed on Jul. 14, 2016, now Pat. No. 9,754,983.

(51) Int. Cl.
| | |
|---|---|
| *H01L 23/02* | (2006.01) |
| *H01L 27/146* | (2006.01) |
| *H01L 21/48* | (2006.01) |
| *H01L 21/56* | (2006.01) |
| *H01L 23/08* | (2006.01) |
| *H01L 23/10* | (2006.01) |
| *H01L 23/31* | (2006.01) |
| *H01L 23/00* | (2006.01) |

(52) U.S. Cl.
CPC .... *H01L 27/14618* (2013.01); *H01L 21/4803* (2013.01); *H01L 21/561* (2013.01); *H01L 23/08* (2013.01); *H01L 23/10* (2013.01); *H01L 23/315* (2013.01); *H01L 23/3114* (2013.01); *H01L 23/3142* (2013.01); *H01L 23/564* (2013.01)

(58) Field of Classification Search
CPC . H01L 27/14618; H01L 23/10; H01L 21/561; H01L 23/3114; H01L 21/4803
USPC .......................................................... 257/680
See application file for complete search history.

(56) References Cited

U.S. PATENT DOCUMENTS

| | | | |
|---|---|---|---|
| 5,528,463 A | 6/1996 | McLellan | |
| 6,018,249 A | 1/2000 | Akram et al. | |
| 6,077,106 A * | 6/2000 | Mish | ................... G06K 19/0706 361/761 |
| 7,091,124 B2 * | 8/2006 | Rigg | .................. H01L 21/76898 257/E21.597 |

* cited by examiner

*Primary Examiner* — Theresa T Doan
(74) *Attorney, Agent, or Firm* — IPTechLaw

(57) ABSTRACT

Implementations of semiconductor packages may include: a die coupled to a glass lid; one or more inner walls having a first material coupled to the die; an outer wall having a second material coupled to the die; and a glass lid coupled to the die at the one or more inner walls and at the outer wall; wherein the outer wall may be located at the edge of the die and the glass lid and the one or more inner walls may be located within the perimeter of the outer wall at a predetermined distance from the perimeter of the outer wall; and wherein a modulus of the first material may be lower than a modulus of the second material.

12 Claims, 9 Drawing Sheets

US 10,079,254 B2

CHIP SCALE PACKAGE AND RELATED METHODS

CROSS REFERENCE TO RELATED APPLICATIONS

This application is a divisional application of the earlier U.S. Utility patent application to Bingzhi Su entitled "Chip Scale Package and Related Methods," application Ser. No. 15/210,716, filed Jul. 14, 2016, now pending, the disclosure of which is hereby incorporated entirely herein by reference.

BACKGROUND

1. Technical Field

Aspects of this document relate generally to semiconductor packages such as chip scale packages. More specific implementations involve chip scale packages for image sensors.

2. Background

Conventionally, a chip scale package (CSP) is designed to be the same size as, or nearly the same size as, the semiconductor die (chip) itself. Conventional CSP packages include various types of semiconductor die, including image sensors. Conventional packages for image sensors include a lid over the portion of the die that includes the sensor array that allows the sensor array to be exposed to light.

SUMMARY

Implementations of semiconductor packages may include: a die coupled to a glass lid; one or more inner walls having a first material coupled to the die; an outer wall having a second material coupled to the die; and a glass lid coupled to the die at the one or more inner walls and at the outer wall; wherein the outer wall may be located at the edge of the die and the glass lid and the one or more inner walls may be located within the perimeter of the outer wall at a predetermined distance from the perimeter of the outer wall; and wherein a modulus of the first material may be lower than a modulus of the second material.

Implementations of semiconductors packages may include one, all, or any of the following:

A maximum cavity wall stress on the outer wall and on the one or more inner walls may be less than 40 MPa.

The semiconductor package may be capable of passing a moisture sensitivity level (MSL) 1 test.

The first material may be a dry film and the second material may be a solder mask.

Implementations of a semiconductor package may be formed using a method of forming semiconductor packages. The method may include: providing a glass lid; patterning a first material on the glass lid; patterning a second material on the glass lid; coupling a wafer to the glass lid at the first material and at the second material; and forming one or more semiconductor packages from the wafer and the glass lid by singulating the wafer and the glass lid; wherein the second material may form an outer wall at the edge of the glass lid and the wafer and the first material may form an inner wall inside the perimeter of the outer wall at a predetermined distance from the perimeter of the outer wall; and wherein a modulus of the first material may be lower than a modulus of the second material.

Implementations of a method of forming semiconductor packages may include one, all or any of the following:

A maximum cavity wall stress on the outer wall and on the one or more inner walls may be less than 40 MPa.

The semiconductor package may be capable of passing a moisture sensitivity level (MSL) 1 test.

The first material may be a dry film and the second material may be a solder mask.

Implementations of semiconductor packages may be manufactured using a method for making semiconductor packages. The method may include: providing a wafer and a glass lid; patterning a first material to form an inner wall on the wafer; patterning a second material on the glass lid to form an outer wall; and coupling the glass lid with the wafer at the first material and at the second material; wherein a modulus of the first material is lower than a modulus of the second material.

Implementation of a method of making semiconductor packages may include one, all or any of the following:

A maximum cavity wall stress on the outer wall and on the one or more inner walls may be less than 40 MPa.

The semiconductor package may be capable of passing a moisture sensitivity level (MSL) 1 test.

The first material may be a dry film and the second material may be a solder mask.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended chip scale package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such chip scale packages, and implementing components and methods, consistent with the intended operation and methods.

Figure 1A:
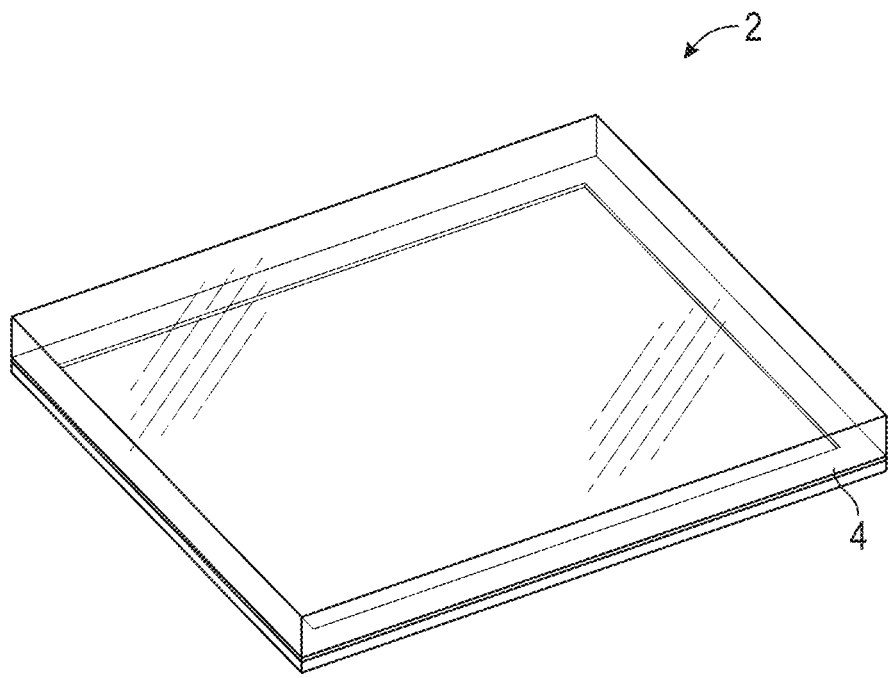
FIG. 1A is a perspective views of conventional semiconductor device with a single cavity wall.
Figure 1B:
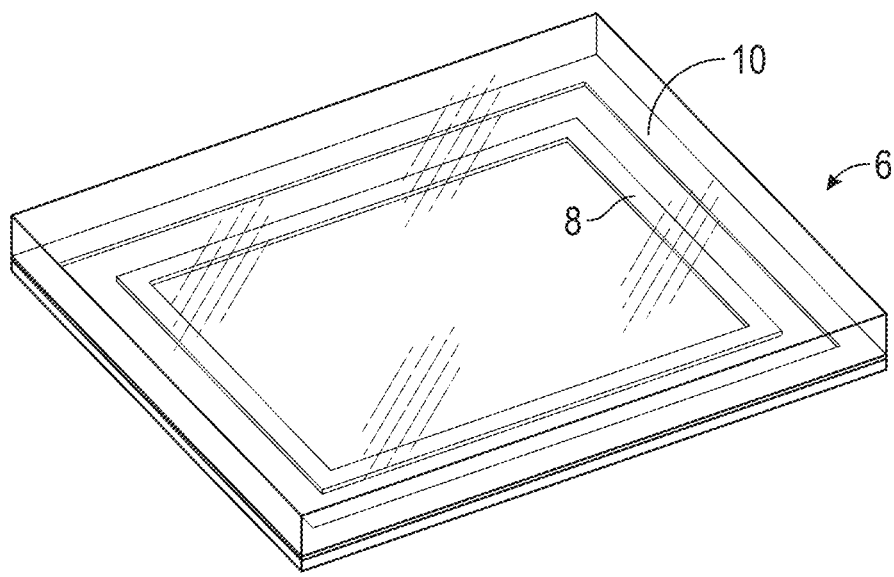
FIG. 1B is a perspective view of another semiconductor device with two concentrically arranged cavity walls.

Referring to FIG. 1A, an example of a conventional chip scale package (CSP) 2 with a single cavity wall 4 is illustrated. The cavity wall 4 serves to bond the lid of the package to the die and also prevents moisture and other contaminants from entering the cavity between the die and the lid. Referring to FIG. 1B, an example of a conventional CSP 6 having a double wall design is illustrated. The conventional double wall design uses the same material for both the inner wall 8 and outer wall 10. Conventional wafer level CSP technology using a hard, high modulus material such as solder mask as the cavity wall works well for small packages. However, when the package or cavity is larger, the package delaminates during reflow due to popcorn cracking. A cavity wall material using a softer, low modulus material such as dry film works better than a high modulus material for large packages. However, the low modulus material has issues during dicing of the packages caused by the inability of the low modulus material to prevent breakdown of the bond between the lid and the die during the stresses induced during singulation (such as sawing).

Figure 2A:
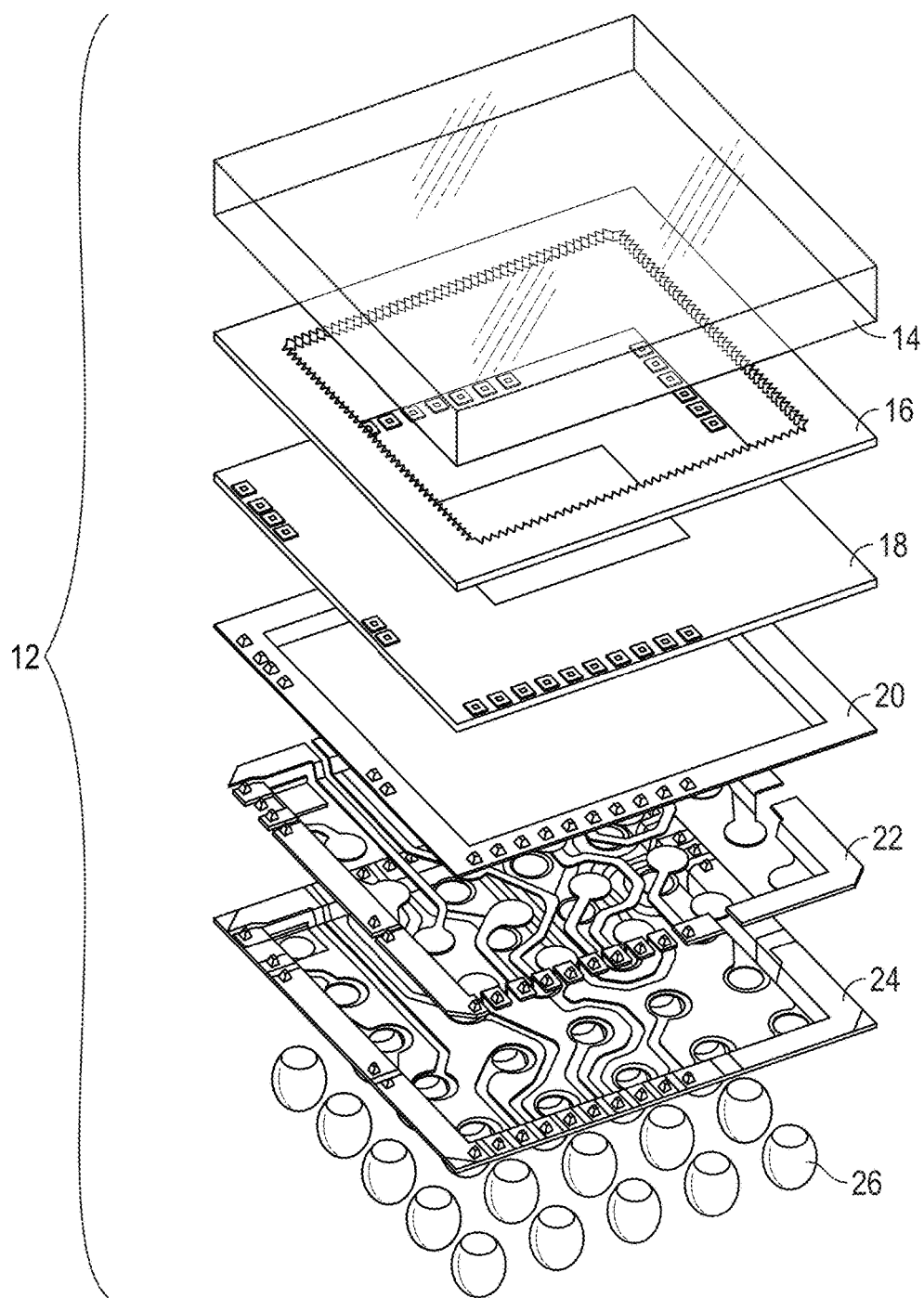
FIGS. 2A-2C show multiple views of a chip scale package (CSP)
Figure 2B:
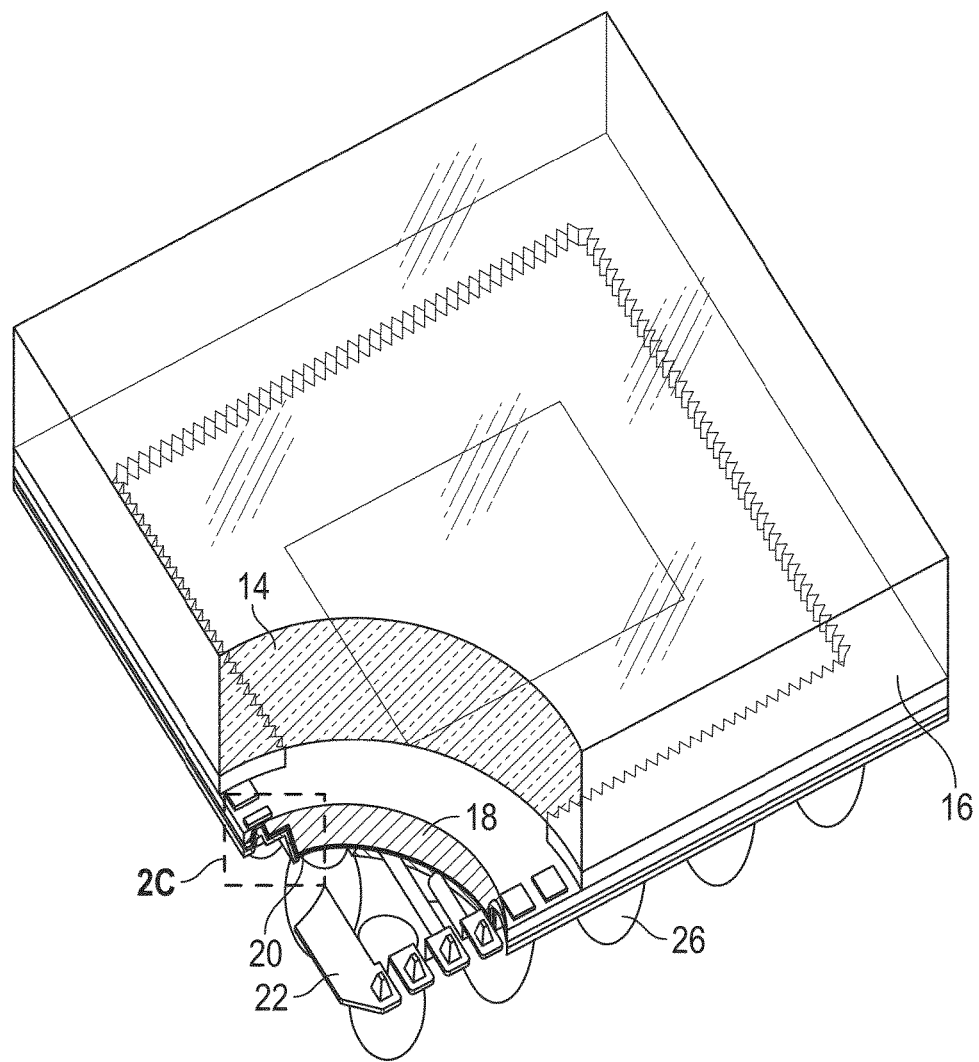
Figure 2C:
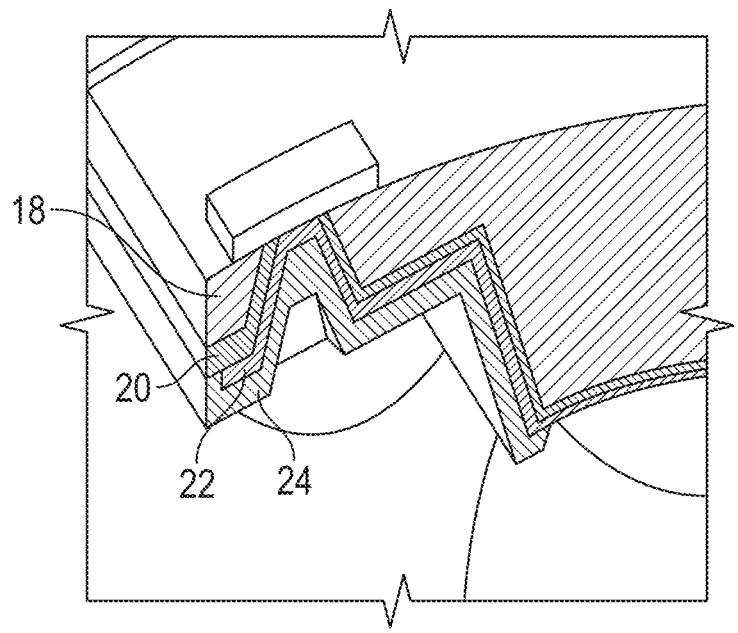

Referring to FIG. 2A, an exploded view of a CSP 12 is illustrated. The CSP includes a glass lid 14, a cavity wall 16, a silicon layer (die or chip) 18, a passivation layer 20, a redistribution layer 22, solder mask film 24 and a ball grid array 26. As can be seen, these layers are designed to provide interconnections from the die or chip to the motherboard to which the package will be fastened while also allowing the sensor portion of the chip 18 to be exposed to light through the glass. In this way, the package is able to convert the received light into electrical signals which are then processed either internal to the package or externally by an image processor in various implementations. In FIGS. 2B and 2C, a CSP is illustrated in an unexploded view with a cutaway section. FIG. 2C shows how the layers of the package are bonded and fastened together to allow both for mechanical sealing of the layers together at the package edge as well as providing for electrical coupling and signal routing of the layers within the package.

Figure 3:
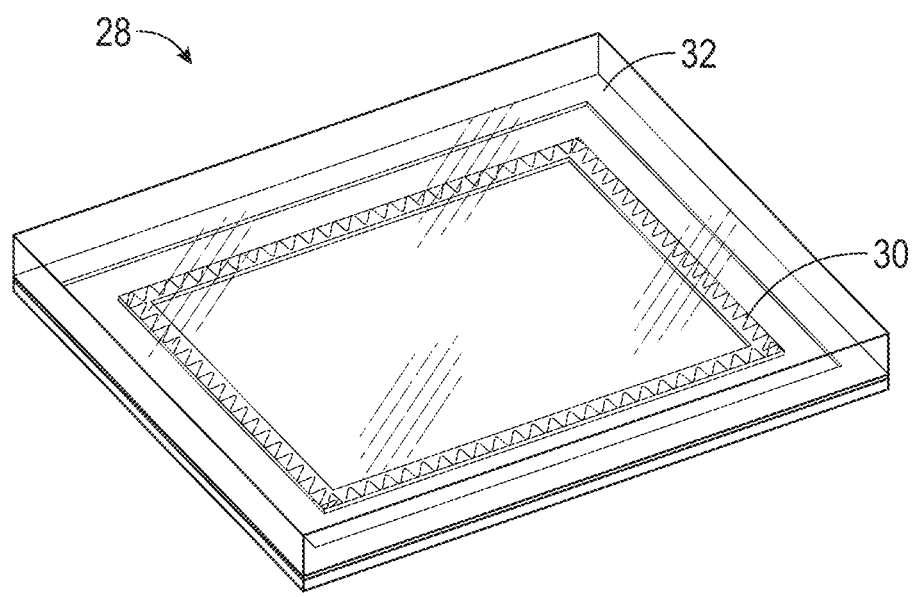
FIG. 3 is a perspective view of an implementation of a multi-composite wall CSP.

Referring to FIG. 3, an implementation of a multi-composite wall CSP 28 is illustrated. This implementation has two cavity walls, an inner wall 30 and an outer wall 32. The material of the inner wall 30 and the outer wall 32 are different from each other. The inner cavity wall 30 includes a low modulus material (soft), such as by non-limiting example, a dry film. For the exemplary purposes of this disclosure the dry film may be manufactured by ShinEtsu MicroSi of Phoenix, Ariz. under the tradename SINR-3170PFM and have a modulus of 150 MPa. The use of a low modulus material for the inner wall acts to reduce stress in the inner cavity and accordingly reduce the stress at the bonding interface during reflow which helps to prevent delamination. The outer cavity wall 32 includes a hard, high modulus material, such as, by non-limiting example, solder mask, which has, by non-limiting example, a modulus of 4800 MPa. As can be observed, the modulus of the low modulus material differs from that of the high modulus material by an order of magnitude, though in various implementations, the difference between the modulus of the low modulus material and the modulus of the high modulus material may be greater or less than this. In particular implementations, the modulus of the low modulus material is less than about 1000 MPa and the modulus of the high modulus material is greater than about 3000 MPa. In other implementations, however, these values may differ, keeping the general relationship that the low modulus material is less than that of the high modulus material.

The use of a high modulus material for the outer wall reinforces the edge of the package so that during the singulation process (particularly where the process involved sawing), the risk of the lid delaminating from the die is reduced. The use of the high modulus material for the outer wall will serve to prevent cracks or chips at the edge of the package formed during sawing from propagating into the cavity, breaching the seal on the cavity, and exposing the cavity to moisture or other contaminants. The cavity walls 30 and 32 may take any of a wide variety of closed shapes, including, by non-limiting example, square, rectangular, circular, ellipsoidal, polygonal, or any other closed shape. In various implementations, the edge of each of the cavity walls 30 and 32 may include various patterns, including zig-zagged, flat, undulating, etc. In various implementations, more than one inner cavity wall may be included, providing for designs that have three or more cavity walls where the inner cavity walls are made of different material(s) with moduli less than the outer cavity wall. In particular implementations, the inner cavity walls may include materials of different moduli from each other, each less than the modulus of the material forming the outer cavity wall.

Figure 4A:
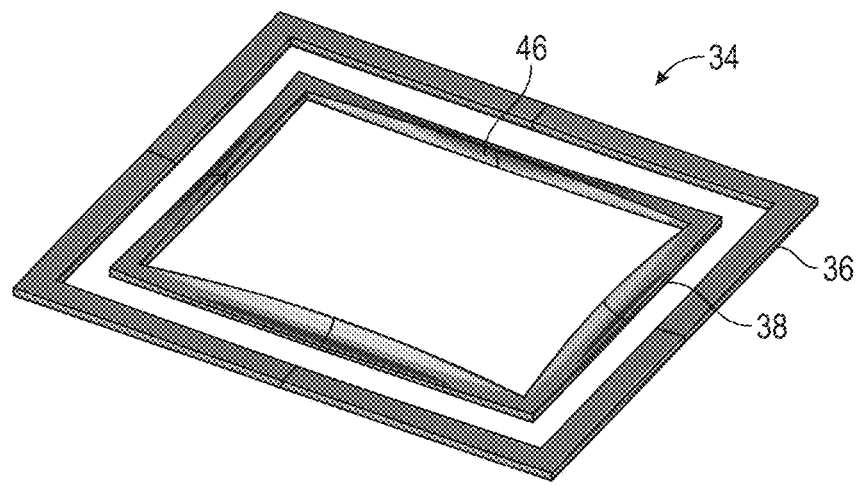
FIG. 4A-4B shows the results of a stress test simulation on a conventional CSP having two cavity walls.
Figure 4A:
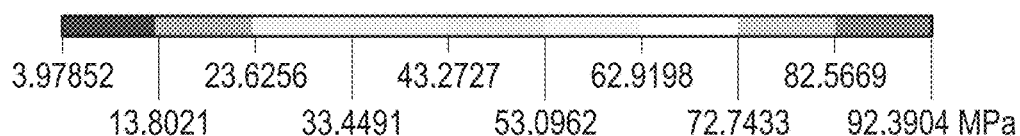
Figure 4B:
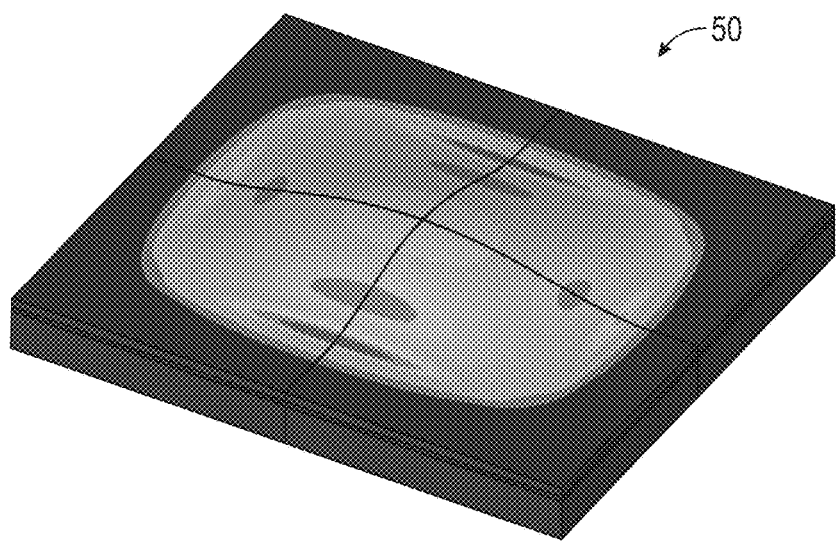
Figure 4B:
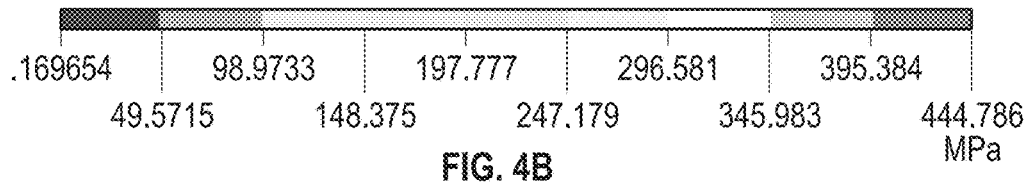
Figure 5A:
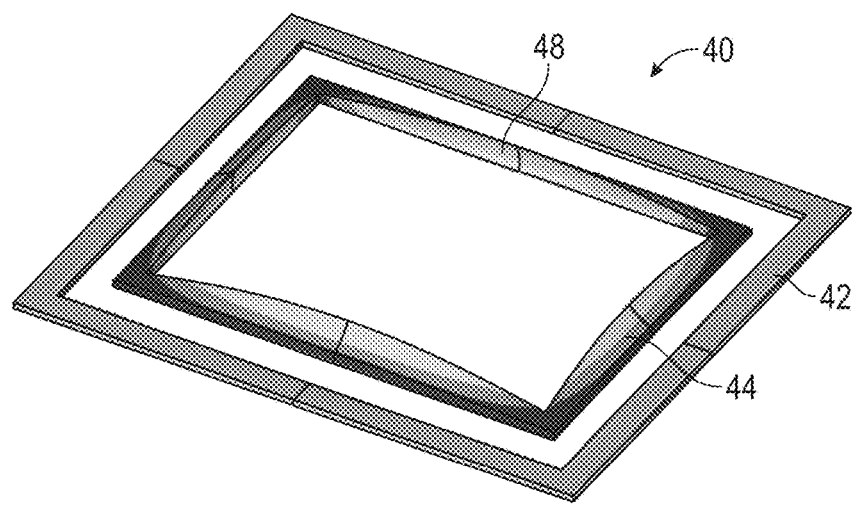
FIG. 5A-5B shows the results of a stress test simulation on an implementation of a multi-composite wall CSP having two cavity walls.
Figure 5A:
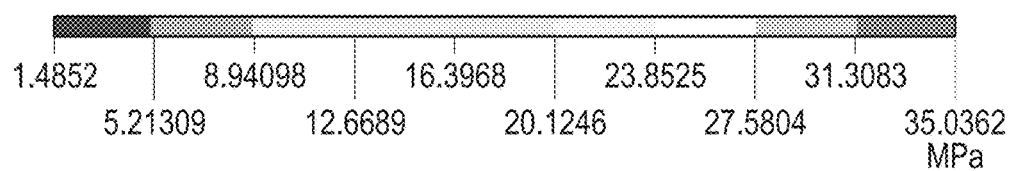
Figure 5B:
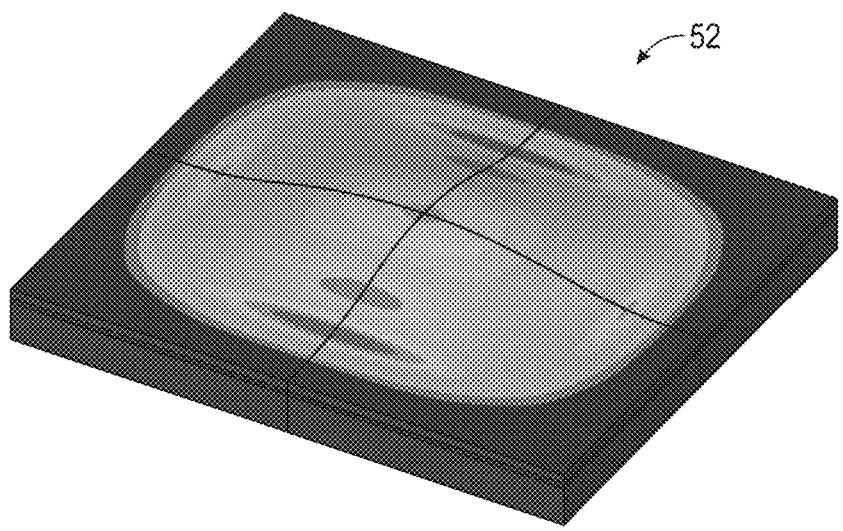
Figure 5B:
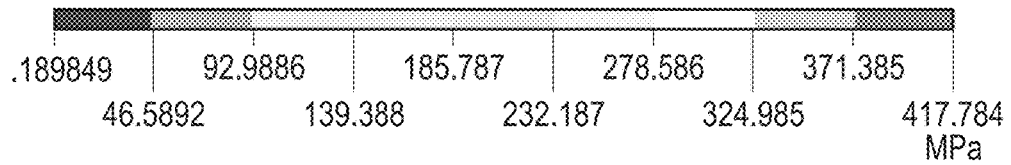

Referring to FIGS. 4A-4B, the results from a stress simulation on a conventional CSP 34 with two cavity walls, each made of the same high modulus material are illustrated. As can be observed from FIG. 4A, the maximum predicted stress of the cavity walls is 92.39 MPa. In FIGS. 5A-5B, the results from a stress simulation on an implementation of a multi-composite CSP 40 having two cavity walls with an inner wall made of a lower modulus material than the outer wall is illustrated. By inspection, the maximum predicted stress of the cavity walls in FIG. 5A is 35.04 MPa, about 30% of the stress of the conventional CSP. The total package size for both 34 and 40 in the simulation is 7 mm×6 mm and the inner cavity of the packages 34 and 40 are 5.5 mm×4.25 mm. The conventional CSP 34 used a conventional solder mask as the cavity wall for both the outer wall 36 and the inner wall 38. The implementation of the multi-composite wall CSP 40 used a conventional solder mask as the outer cavity wall 42 and dry film manufactured by ShinEtsu under the tradename SINR-3170PFM as the inner cavity wall 44. For the purposes of the simulation, both packages 34 and 40 are were subjected to the thermal cycling of the same reflow process. The resulting stress on the silicon of the CSP is illustrated in FIGS. 4B and 5B. The stress is also decreased on the silicon of the package as illustrated in FIGS. 4B and 5B. The conventional CSP 50 has a maximum silicon stress of 445 MPa while the maximum silicon stress of the multi-composite CSP 52 is only 418 MPa.

The ability to reduce the maximum stress experienced by a cavity wall by 70% by using a cavity wall that has a lower material modulus is an good result in view of what is currently known about conventional CSPs that employ two cavity walls with the same high modulus material.

The conventional CSP package in the simulation cannot pass the moisture sensitivity level (MSL) 3 test due to the high stress in the cavity wall and at the bonding interface. In contrast, the multi-composite CSP 52 in this simulation could pass the MSL3 test and even the MSL 1 test because of the reduced stress in the cavity wall and at the bonding interface.

The moisture/reflow sensitivity level (MSL) is a standard for the time period in which a moisture sensitive device can be exposed to ambient room conditions before moisture seeps into the device. Moisture trapped inside a device can expand and result in delamination, condensation on the interior of the glass, wire bond damage, die damage, internal cracks, bulging and popping. The MSL determines how long the CSP may be out of its original moisture sensitive bag before being mounted and reflowed. An MSL 3 device must be reflowed within 168 hours of removal from the bag while an MSL 1 device has an unlimited floor life out of the bag. Since CSP packages like those disclosed herein can pass the MSL 1 test, they may have far greater flexibility of use and may significantly reduce risk of reliability failures in the field due to moisture infiltration.

Figure 6A:
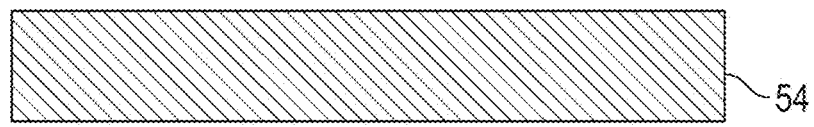
FIGS. 6A-6F shows a method for forming an implementation of a multi-composite wall CSP.
Figure 6B:
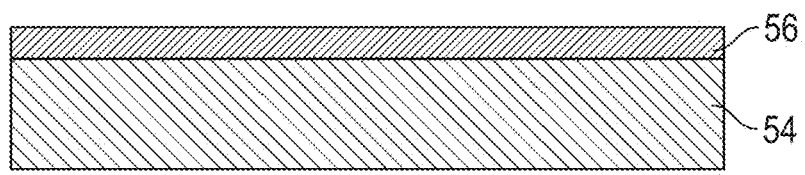
Figure 6C:
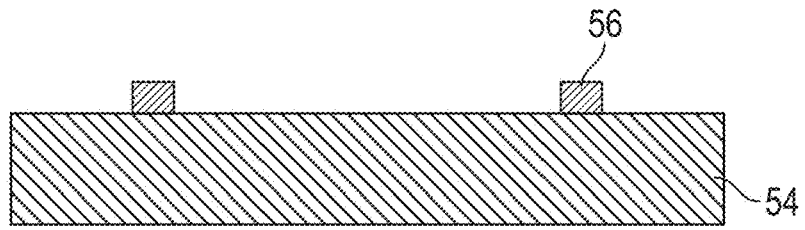
Figure 6D:
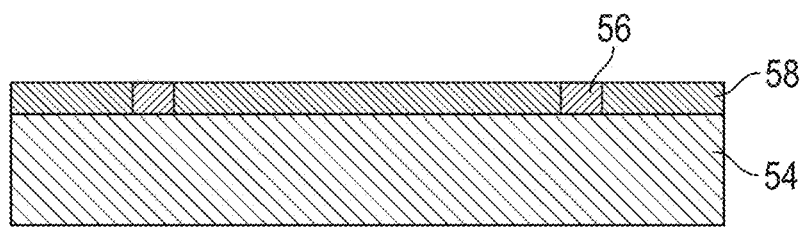
Figure 6E:
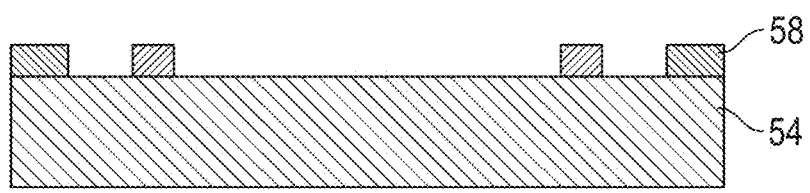
Figure 6F:
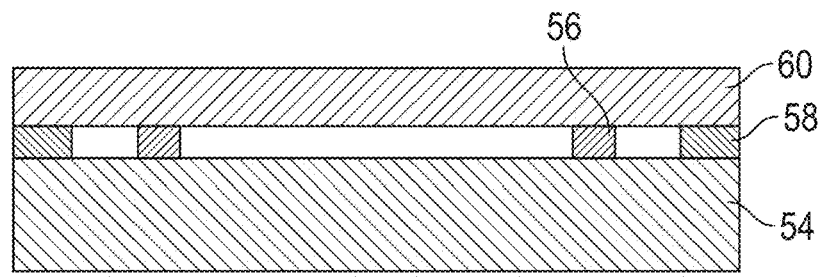

Referring to FIGS. 6A-6F, an implementation of a first method for forming an implementation of a multi-composite wall CSP is illustrated. In FIG. 6A, a glass lid 54 is provided. In FIGS. 6B-6C, a first material 56 is patterned on the glass lid 54 to form the structure of an inner cavity wall. In FIGS. 6D-6E, a second material 58 is formed on the glass lid 54 by being coated over the pattern of the first material and then patterned to form an outer cavity wall after removal of the excess material. The process of patterning the first material 56 and the second material 58 could be carried out, by non-limiting example, by stencil printing, photolithography, masking, etching, application of preformed stencils, any combination thereof, or any other method of forming the layer. In FIG. 6F, a wafer 60 is coupled to the glass lid 54 at the first material 56 and at the second material 58 to bond the wafer 60 to the lid 54. In an alternate implementation, the first material 56 and second material 58 may be patterned on the wafer 60 and the glass lid 54 may be coupled to the wafer 60 at the first material 56 and the second material 58. The one or more semiconductor packages are then formed from the wafer 60 and glass lid 54 by singulation of the packages, which may be done by sawing, laser cutting, or any other method of singulating semiconductor devices. The second material 58 forms an outer wall at the edge of the glass lid 54 and the wafer 60. The first material 56 forms an inner wall inside the perimeter of the outer wall at a predetermined distance from the perimeter of the outer wall. As previously disclosed, more than one inner wall may be formed in various implementations. Also, the modulus of the first material is lower than the modulus of the second material forming the outer wall.

Figure 7A:
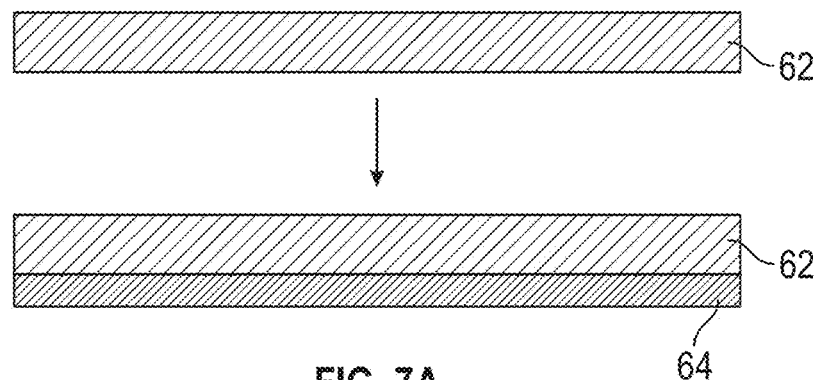
FIGS. 7A-7D shows another method for forming an implementation of a multi-composite wall CSP.
Figure 7B:
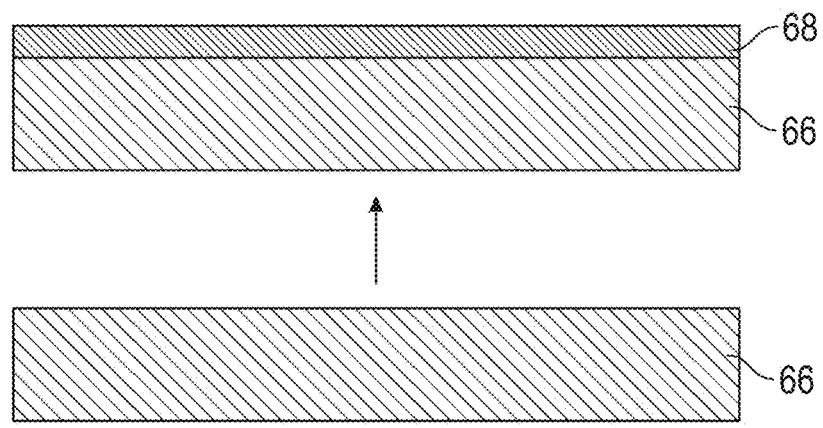
Figure 7C:
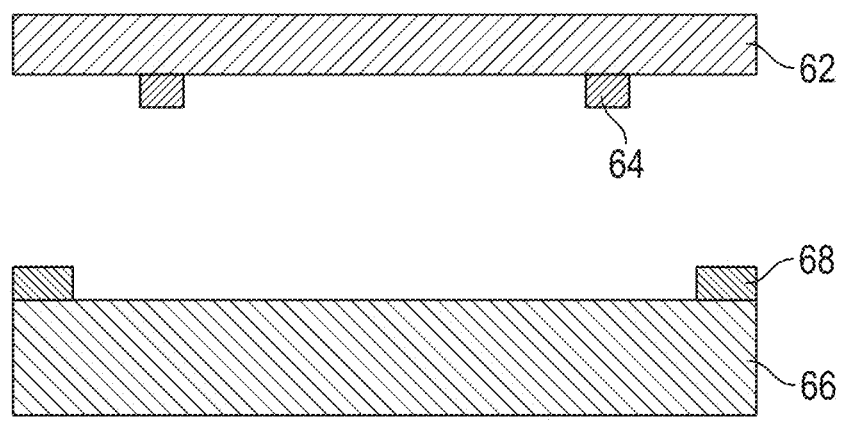
Figure 7D:
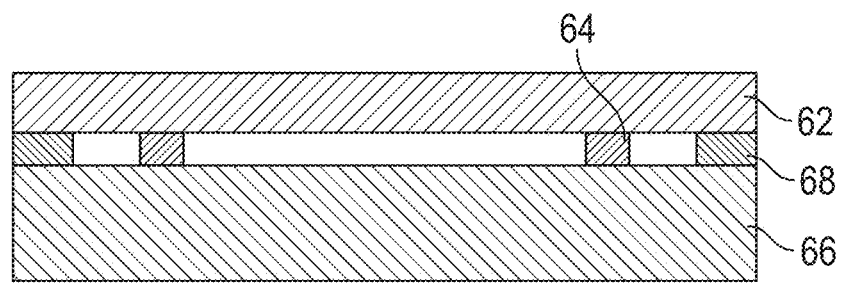

Referring to FIGS. 7A-7D, a second implementation of a method for forming a semiconductor package is illustrated. Referring to FIGS. 7A and 7C, a wafer 62 is provided and a first material 64 is patterned using any of the techniques disclosed herein to form an inner wall on the wafer 62. Referring to FIG. 7B, a glass lid 66 is provided and a second material 68 is patterned on the glass lid 66 to form an outer cavity wall. As illustrated in FIGS. 7C-7D, the glass lid 66 is then coupled with the wafer 62 at the first material 64 and at the second material 68. As previously discussed, the modulus of the first material is lower than the modulus of the second material. By non-limiting example, the first material is a dry film and the second material is a solder mask. Multiple inner walls may be formed in implementations of the method as previously disclosed.

In places where the description above refers to particular implementations of chip scale packages and implementing components, sub-components, methods and sub-methods, it should be readily apparent that a number of modifications may be made without departing from the spirit thereof and that these implementations, implementing components, sub-components, methods and sub-methods may be applied to other chip scale packages.

What is claimed is:

1. A method for forming a semiconductor package, the method comprising:
    providing a glass lid;
    patterning a first material on the glass lid;
    patterning a second material on the glass lid;
    coupling a wafer to the glass lid at the first material and at the second material; and
    forming one or more semiconductor packages from the wafer and the glass lid by singulating the wafer and the glass lid;
    wherein the second material forms an outer wall at the edge of the glass lid and the wafer and the first material forms an inner wall inside the perimeter of the outer wall at a predetermined distance from the perimeter of the outer wall; and
    wherein a modulus of the first material is lower than a modulus of the second material.

2. The method of claim 1, wherein a maximum cavity wall stress on the outer wall and on the one or more inner walls is less than 40 MPa.

3. The method of claim 1, wherein the semiconductor package is capable of passing a moisture sensitivity level (MSL) 1 test.

4. The method of claim 1, wherein the first material is a dry film and the second material is a solder mask.

5. A method for making a semiconductor package, the method comprising:
    providing a wafer and a transparent lid;
    patterning a first material to form an inner wall on the wafer;
    patterning a second material on the transparent lid to form an outer wall; and
    coupling the transparent lid with the wafer at the first material and at the second material;
    wherein a modulus of the first material is lower than a modulus of the second material.

6. The method of claim 5, wherein a maximum cavity wall stress on the outer wall and on the one or more inner walls is less than 40 MPa.

7. The method of claim 5, wherein the semiconductor package is capable of passing a moisture sensitivity level (MSL) 1 test.

8. The method of claim 5, wherein the first material is a dry film and the second material is a solder mask.

9. A method for forming a semiconductor package, the method comprising:
    providing a transparent lid;
    patterning a first material on the transparent lid;
    patterning a second material on the transparent lid;
    coupling a wafer to the transparent lid at the first material and at the second material; and
    forming one or more semiconductor packages from the wafer and the transparent lid by singulating the wafer and the glass lid;
    wherein the second material forms an outer wall at the edge of the transparent lid and the wafer and the first material forms an inner wall inside the perimeter of the outer wall at a predetermined distance from the perimeter of the outer wall; and
    wherein a modulus of the first material is lower than a modulus of the second material.

10. The method of claim 9, wherein a maximum cavity wall stress on the outer wall and on the one or more inner walls is less than 40 MPa.

11. The method of claim 9, wherein the semiconductor package is capable of passing a moisture sensitivity level (MSL) 1 test.

12. The method of claim 9, wherein the first material is a dry film and the second material is a solder mask.

\* \* \* \* \*